(12) United States Patent  (10) Patent No.: US 8,124,534 B2
Wallner et al.  (45) Date of Patent: Feb. 28, 2012

(54) MULTIPLE EXPOSURE AND SINGLE ETCH INTEGRATION METHOD

(75) Inventors: Jin Wallner, Pleasant Valley, NY (US); Thomas A. Wallner, Pleasant Valley, NY (US); Ying Zhang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 885 days.

(21) Appl. No.: 12/177,690

(22) Filed: Jul. 22, 2008

(65) Prior Publication Data

US 2010/0022088 A1  Jan. 28, 2010

(51) Int. Cl.
*H01L 21/302* (2006.01)
(52) U.S. Cl. ......... 438/705; 438/712; 438/719; 438/723
(58) Field of Classification Search .................. 438/705, 438/712, 719, 723
See application file for complete search history.

(56) References Cited

U.S. PATENT DOCUMENTS 6,475,906 B1 * 11/2002 Lee ................................ 438/637
2008/0233738 A1 * 9/2008 Beyer et al. .................... 438/643
2009/0273013 A1 * 11/2009 Winstead et al. .............. 257/315

* cited by examiner

*Primary Examiner* — Binh X Tran
(74) *Attorney, Agent, or Firm* — Ian D. MacKinnon; Ira Blecker

(57) ABSTRACT

A process including forming a silicon layer over a semiconductor wafer having features thereon and then selectively ion implanting in the silicon layer to form ion implanted regions. The step of selectively ion implanting is repeated as many times as necessary to obtain a predetermined number and density of features. Thereafter, the silicon layer is etched to form openings in the silicon layer that were formerly occupied by the ion implanted regions. The opened areas in the silicon layer form a mask for further processing of the semiconductor wafer.

24 Claims, 12 Drawing Sheets

MULTIPLE EXPOSURE AND SINGLE ETCH INTEGRATION METHOD

BACKGROUND OF THE INVENTION

The invention lies in the field of semiconductor processing and relates, more specifically, to a method for fabricating a semiconductor wafer using multiple exposure.

Integrated semiconductor circuits are generally fabricated with lithographic processing of a mask in order to transfer the structure into the underlying layers of the semiconductor wafer in a subsequent process step, e.g. with the aid of an etching or an implantation process step. In this case, the mask generally comprises a thin radiation-sensitive layer, usually an organic photoresist layer, which is deposited on the semiconductor wafer. This thin radiation-sensitive layer is then irradiated in the desired regions, the irradiation generally being effected optically with the aid of a photomask. The photoresist layer that has been chemically altered by the radiation is then developed. In positive resist technology, the photoresist decomposes at the exposed locations and the non-irradiated regions remain masked. In negative resist technology, in precisely the opposite fashion, the exposed locations are marked, while the unexposed resist is removed during development. The resulting pattern in the photoresist layer serves as a mask for the subsequent process step by means of which this pattern is then transferred into the underlying layers in the semiconductor wafer.

On account of the increasing miniaturization of the integrated circuits, it is necessary to image ever smaller structures with feature sizes below 100 nm on the photoresist layer and then to transfer this pattern into the underlying layers of the semiconductor wafer. The lithographic production of such small structures is difficult particularly in regions with a dense arrangement of structures with dimensions in the region of the resolution limit of the optical exposure methods.

Accordingly, minimum feature size and pitch are driving the use of multiple lithography exposures and multiple etches to create a pattern which previously could be done with only one exposure and one etch. Such multiple lithography exposure and etch process steps give rise to many issues.

BRIEF SUMMARY OF THE INVENTION

The invention has been achieved by providing, according to a first aspect of the invention, a multiple exposure and single etch integration method comprising the steps of:
  obtaining a semiconductor wafer having features thereon;
  depositing sequential layers of oxide and silicon over the semiconductor wafer and the features;
  selectively ion implanting in the silicon layer to form first ion implanted regions;
  selectively ion implanting in the silicon layer to form second ion implanted regions;
  reactive ion etching the silicon layer to form openings in the silicon layer that were formerly occupied by the ion implanted regions; and
  etching the oxide layer to extend the openings in the silicon layer through the oxide layer to the features.

According to a second aspect of the invention, there is provided a multiple exposure and single etch integration method comprising the steps of:
  obtaining a semiconductor wafer having features thereon;
  depositing sequential layers of oxide and silicon over the semiconductor wafer and the features;
  selectively ion implanting in the silicon layer to form first ion implanted regions;
  reactive ion etching the silicon layer to form openings in the silicon layer that were formerly occupied by the ion implanted regions; and
  etching the oxide layer to extend the openings in the silicon layer through the oxide layer to the features.

According to a third aspect of the invention, there is provided a multiple exposure and single etch integration method comprising the steps of:
  obtaining a semiconductor wafer having gate stacks thereon;
  depositing a barrier nitride layer over the gate stacks and the semiconductor wafer;
  depositing sequential layers of oxide, silicon, first anti-reflective compound (ARC) and first photoresist;
  lithographically exposing and developing the first photoresist layer to form first image openings in the first photoresist layer;
  etching the first ARC layer through the first image openings in the first photoresist layer;
  ion implanting in the silicon layer through the first images openings in the first ARC and photoresist layers to form first ion implanted regions;
  stripping the first photoresist and ARC layers;
  depositing a second layer of ARC over the silicon layer and depositing a second layer of photoresist over the second layer of ARC;
  lithographically exposing and developing the second layer of photoresist to form second image openings in the photoresist, the second image openings being offset from the first image openings;
  etching the second ARC layer through the second image openings in the second photoresist layer;
  ion implanting in the silicon layer through the second image openings in the second ARC and photoresist layers to form second ion implanted regions;
  stripping the second photoresist and ARC layers;
  reactive ion etching the silicon layer to form openings in the silicon layer that were formerly occupied by the ion implanted regions;
  etching the oxide layer to extend the openings in the silicon layer through the oxide layer; and
  etching the nitride layer to extend the openings in the silicon and oxide layers through the nitride layer.

According to a fourth aspect of the invention, there is provided a multiple exposure and single etch integration method comprising the steps of:
  obtaining a semiconductor wafer having gate stacks thereon;
  depositing a barrier nitride layer over the gate stacks and the silicon wafer;
  depositing sequential layers of oxide, silicon, first anti-reflective compound (ARC) and first photoresist;
  lithographically exposing and developing the first photoresist layer to form first image openings in the first photoresist layer;
  plasma etching the first ARC layer through the first image openings in the first photoresist layer;
  ion implanting in the silicon layer through the first images openings in the first ARC and photoresist layers to form first ion implanted regions;
  stripping the first photoresist and ARC layers;
  reactive ion etching the silicon layer to form openings in the silicon layer that were formerly occupied by the ion implanted regions;
  etching the oxide layer to extend the openings in the silicon layer through the oxide layer; and etching the nitride layer to extend the openings in the silicon and oxide layers through the nitride layer.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1A:
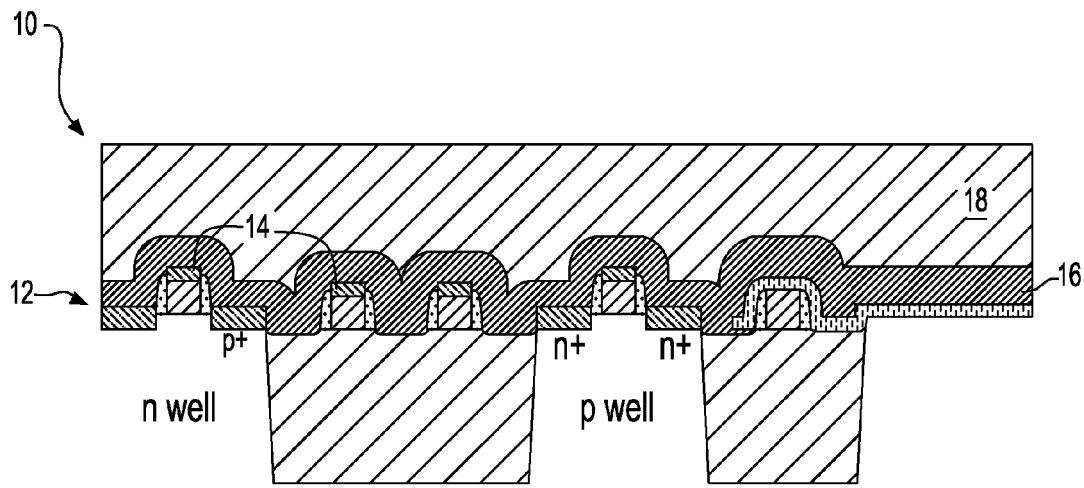
FIGS. 1A through 1I schematically illustrate a conventional double exposure, double etch lithography process.

Referring to the drawings in more detail, and particularly referring to FIGS. 1A through 1I, there is illustrated a conventional double exposure, double etch lithography process. Referring now to FIG. 1A, there is shown a semiconductor wafer 10 having a plurality of devices 12 on the semiconductor wafer 10. The semiconductor devices 12 have gates 14. Situated over the gates 14 is a barrier nitride layer 16 followed by one or more layers of an oxide 18. In the processing of the semiconductor wafer 10 it is desired to form a contact array to make contact through the barrier nitride layer 16 and oxide layer 18 between the gates 14 and the first level of metal (not shown) in the so-called back end of the line layers. However, due to the small feature sizes, nominally 32 nanometers (nm), forming the contact array is difficult because 32 nm is below the resolution of the lithography tools. Accordingly, the contact array is formed in a double exposure, double etch process to get around the resolution limit of the lithography tools.

Figure 1B:
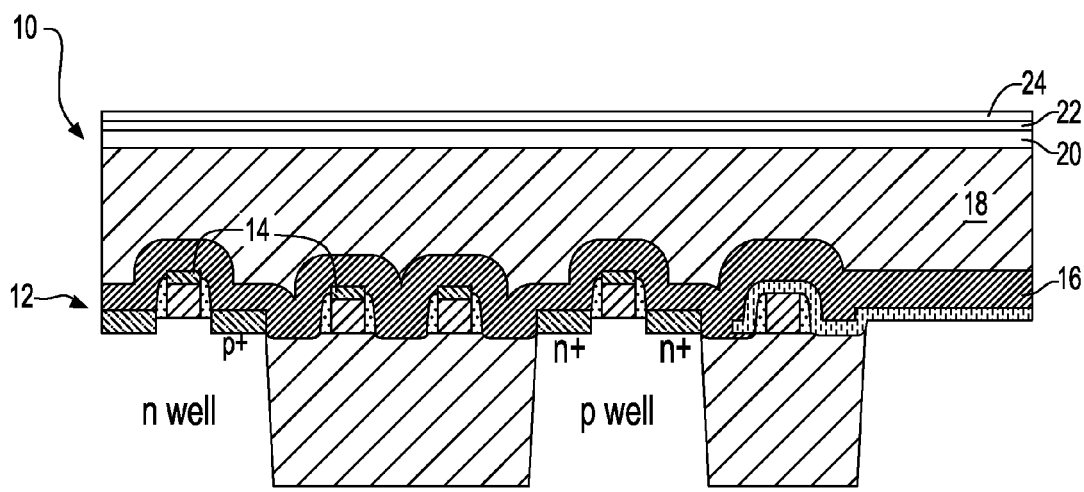

In the first step of forming the contact array, a photoresist 24 is applied over the oxide layer 18. To aid in the lithography imaging, an optically dense layer (ODL) 20 and anti-reflective compound (ARC) layer 22 may also be applied as shown in FIG. 1B.

Figure 1C:
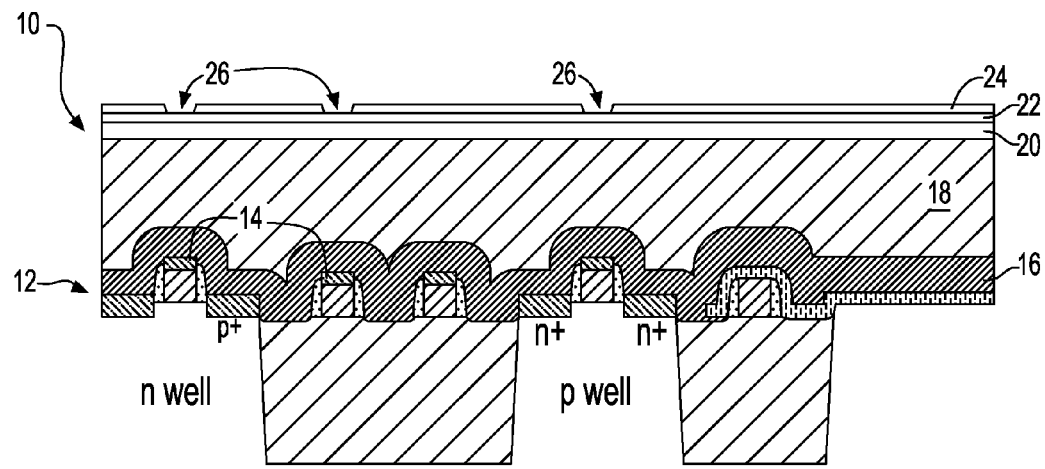
Figure 1D:
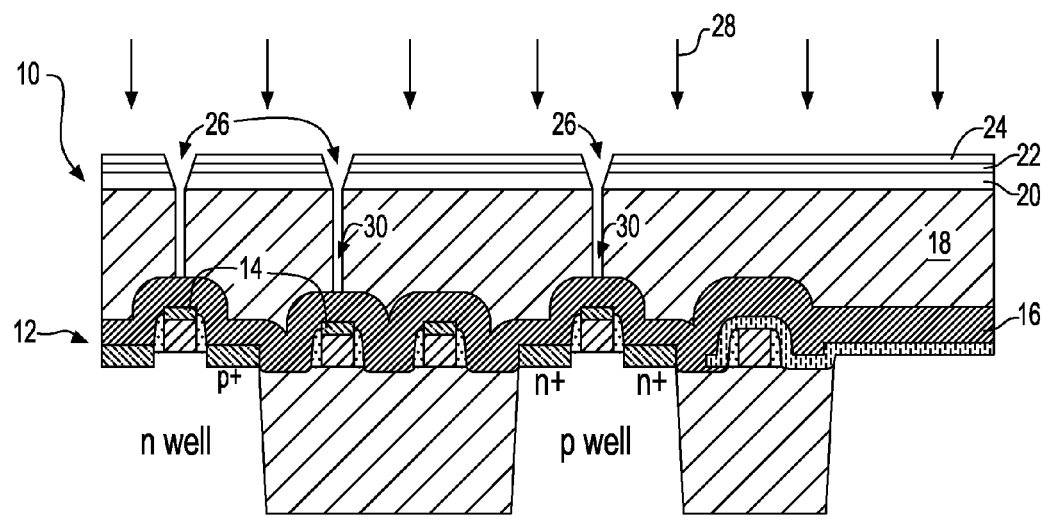

The photoresist layer 24 is then exposed and developed as shown in FIG. 1C to form image openings 26 as shown in FIG. 1D which when transferred into the underlying structure will form a first portion of the contact arrays. The photoresist layer 24 with the image openings 26 is now a photoresist mask.

Referring now to FIG. 1D, the semiconductor wafer 10 is exposed to reactive ion etching (RIE) 28 to selectively remove the ARC layer 22, optically dense layer 20 and oxide 18 to form the first portion of the contact array openings 30. As can be appreciated, the image openings 26 in the photoresist mask 24 have been transferred into the oxide 18.

Figure 1E:
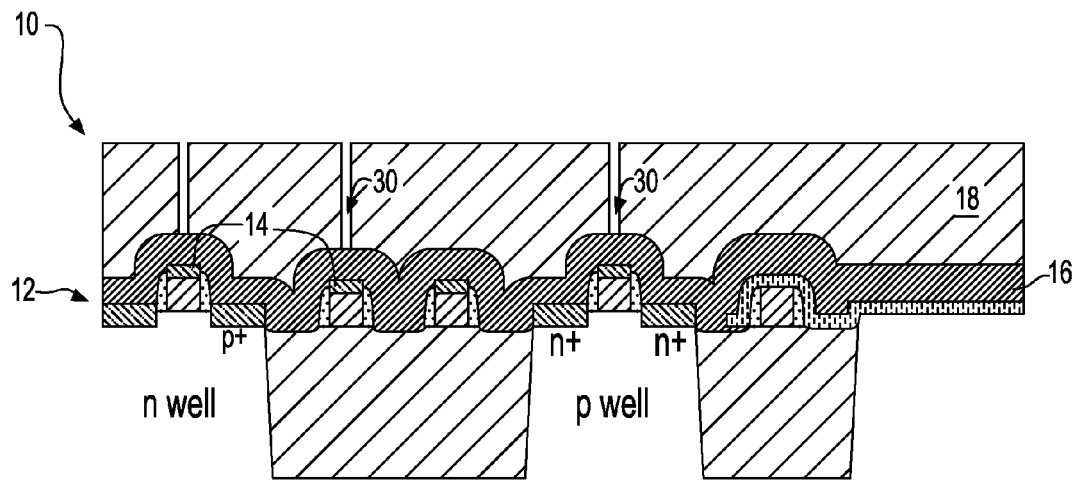

The optically dense layer 20, ARC layer 22 and photoresist layer 24 are then stripped by conventional means to result in the structure shown in FIG. 1E.

Figure 1F:
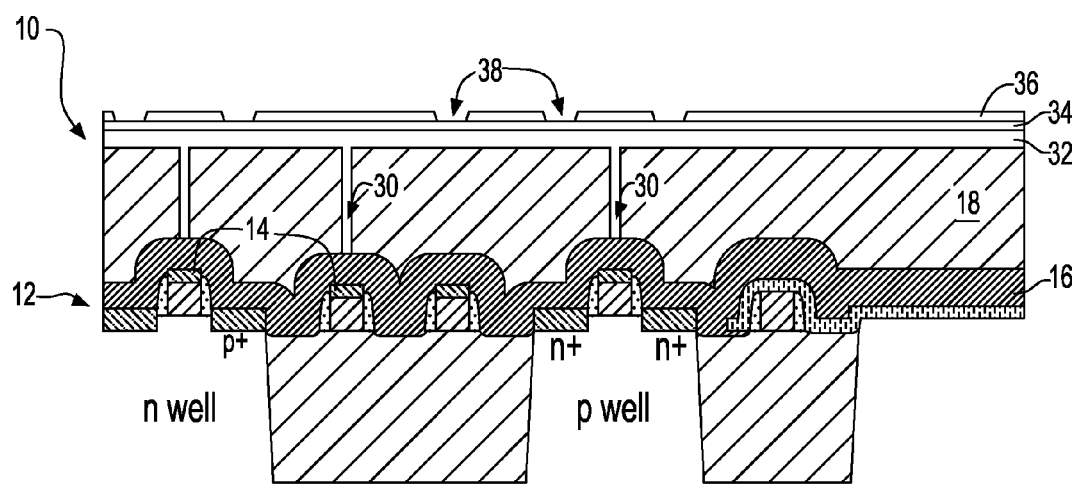

At this point in the fabrication process, only a first portion of the contact array openings 30 have been formed. To form the remainder of the contact array openings, it is necessary to do a second exposure and etch process. Referring now to FIG. 1F, a second optically dense layer 32, ARC layer 34 and photoresist layer 36 are applied. The photoresist layer 36 is then exposed and developed to form image openings 38 as shown in FIG. 1F which when transferred into the underlying structure will form a second portion of the contact arrays. The photoresist layer 36 with the image openings 38 is now a photoresist mask. It must be noted that when the optically dense layer 32 is applied, the material of the optically dense layer 32 also fills the first portion of the contact array openings 30. It has been found by the present inventors that this material of the optically dense layer 32 is not always removed in subsequent processing and thus remains as a defect which can cause a portion or all of the semiconductor wafer 10 to become worthless.

Figure 1G:
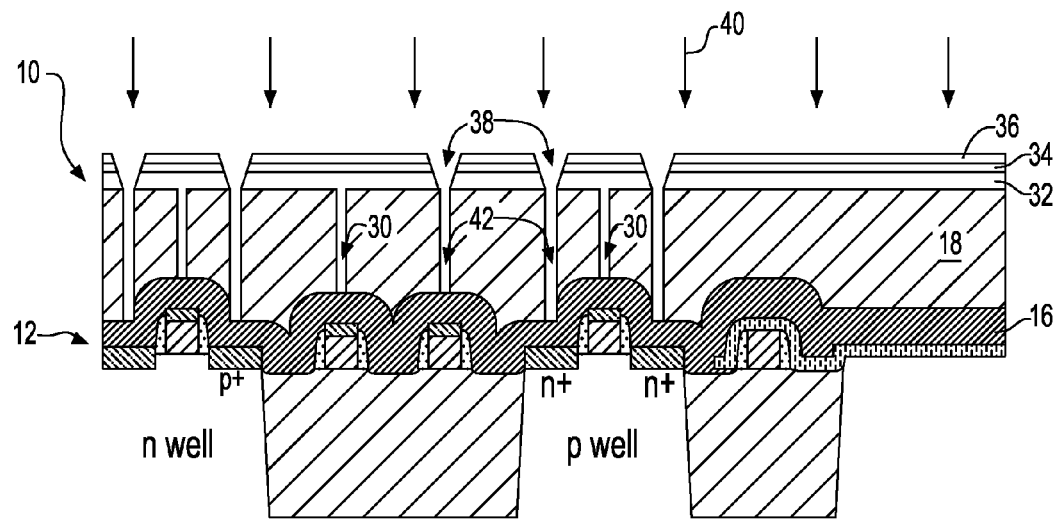

Referring now to FIG. 1G, the semiconductor wafer 10 is exposed to reactive ion etching (RIE) 40 to again selectively remove the ARC layer 34, optically dense layer 34 and oxide 18 to form the second portion of the contact array openings 42. Again, the image openings 38 in the photoresist mask 36 have been transferred into the oxide 18.

Figure 1H:
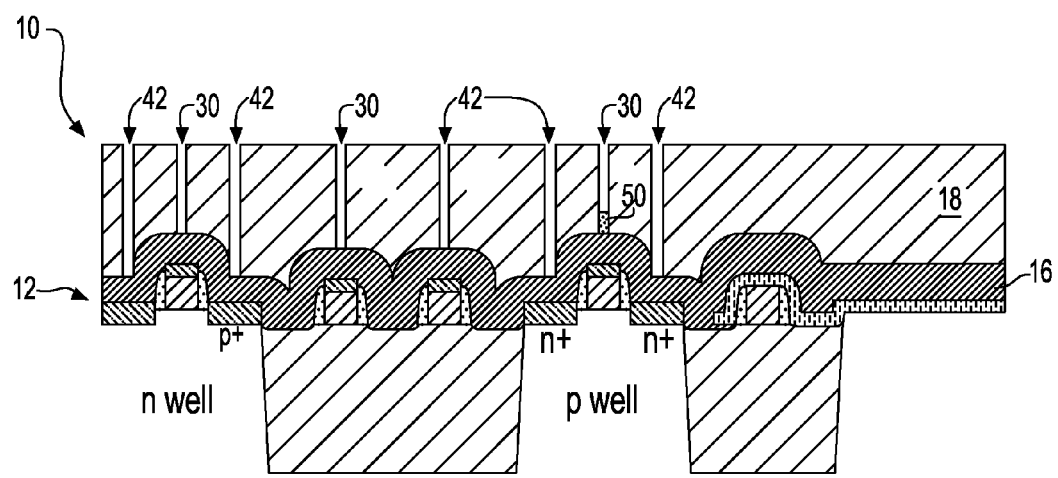

The photoresist layer 36, ARC layer 34 and optically dense layer (ODL) 32 are then conventionally stripped as shown in FIG. 1H. As noted earlier, some of the optically dense layer 32 material may be incompletely removed from the first portion of the contact array openings 30 as shown at 50.

Figure 1I:
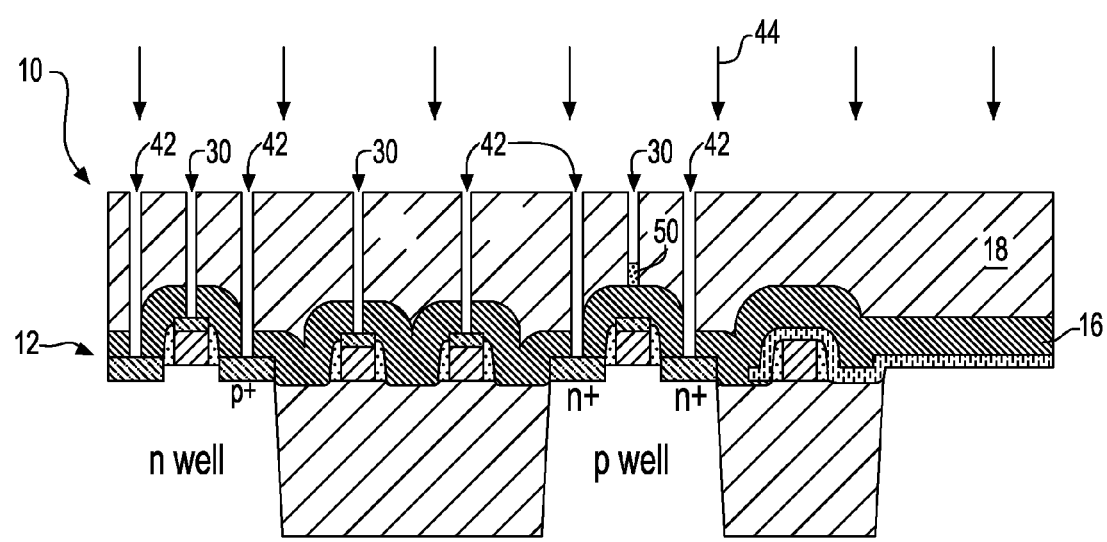

Then, the semiconductor wafer 10 is exposed to reactive ion etching 44 to transfer the first portion of the contact array openings 30 and second portion of the contact array openings 42 into the barrier nitride layer 16 as shown in FIG. 1I. Where there was some residual ODL left in the openings 30 as shown at 50 in FIG. 1H, the openings 30 may not be transferred into the barrier nitride layer as shown at 50 in FIG. 1I.

In subsequent steps which are not shown and are not necessary to the understanding of the present invention, the contact array openings 30, 42 would be filled with metallization and the metal layers built.

Figure 2A:
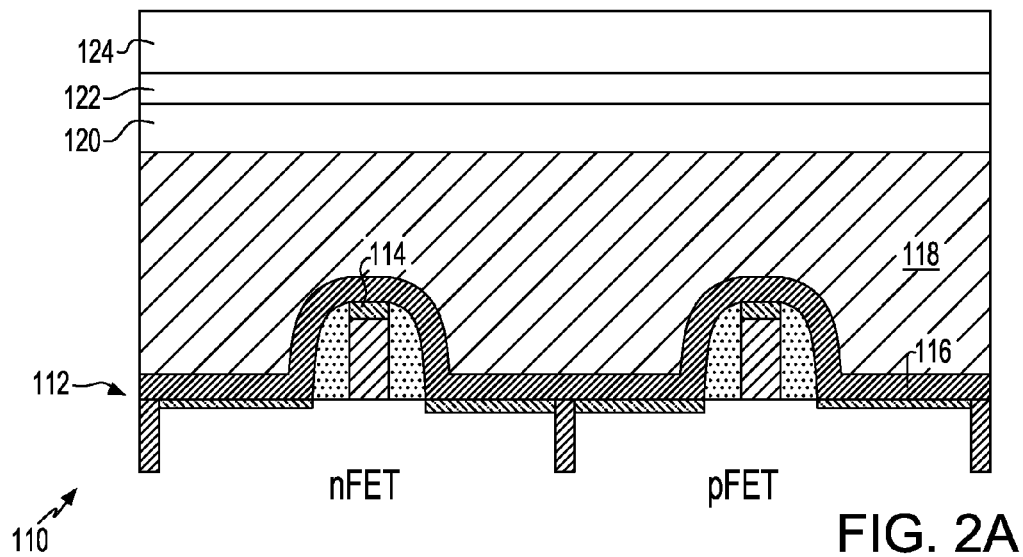
FIGS. 2A though 2M schematically illustrate a multiple exposure, single etch process according to the present invention.

Turning now to FIGS. 2A though 2M, there is schematically illustrated a multiple exposure, single etch process according to the present invention. Semiconductor wafer 110 contains a plurality of semiconductor devices 112 having gates 114. On top of the gates 114 is a barrier nitride layer 116 followed by one or more oxide layers 118. As shown in FIG. 2A, the semiconductor wafer 110 further includes a silicon mask layer 120 which is preferably a polysilicon formed at a temperature less than about 400° C. or amorphous silicon. Thereafter a conventional ARC layer 122 and a photoresist layer 124 are spun on the semiconductor wafer 110. ODL is not required for the present invention although it may be added if desired. ODL is necessary in the prior art to fill vias and render a flat surface prior to the formation of the second vias in the double expose steps.

Figure 2B:
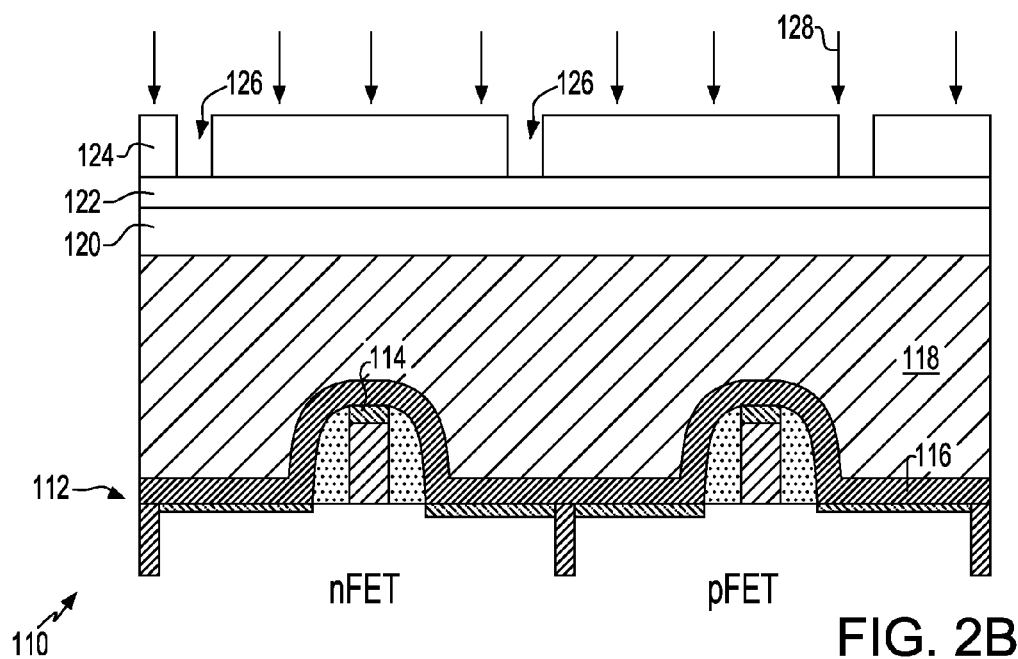
Figure 2C:
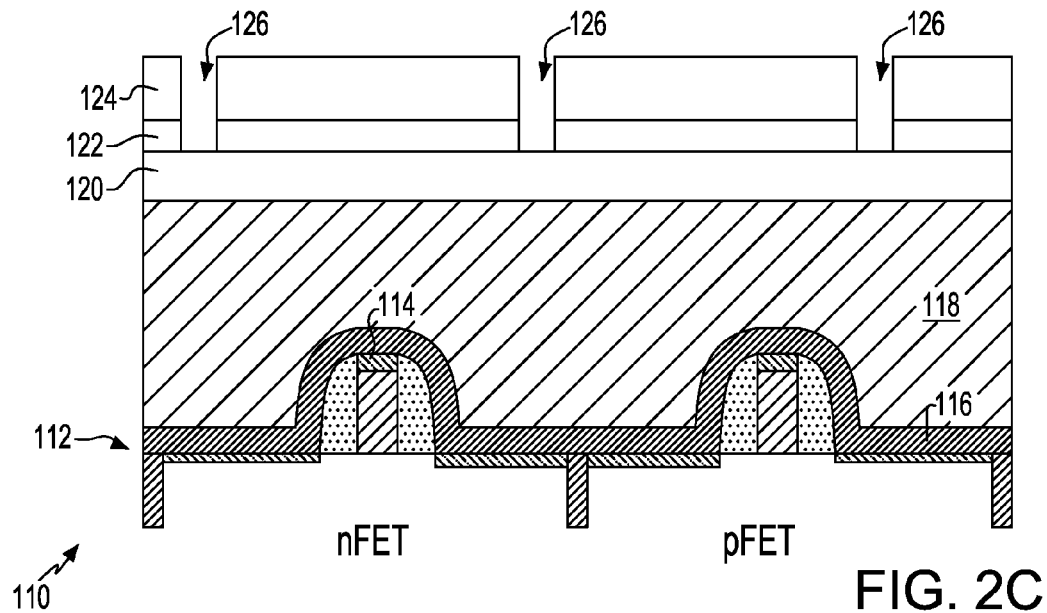

The photoresist layer 124 is exposed and developed to form first image openings 126 which when transferred into the underlying layers will form the first feature openings. As thus exposed and developed, the photoresist layer 124 forms a photoresist mask as illustrated in FIG. 2B. Thereafter, the semiconductor wafer 110 is exposed to plasma etching as indicated by arrows 128 for a predetermined amount of time to remove the ARC layer 122 through the image openings 126. Plasma etching may be by inductively coupled plasma or capacitively coupled plasma with one or dual RF frequency power and a fluorine carbon gas such as $CF_4$, $CH_2F_2$, $CH_3F$ and combinations thereof. The resultant structure is shown in FIG. 2C.

Figure 2D:
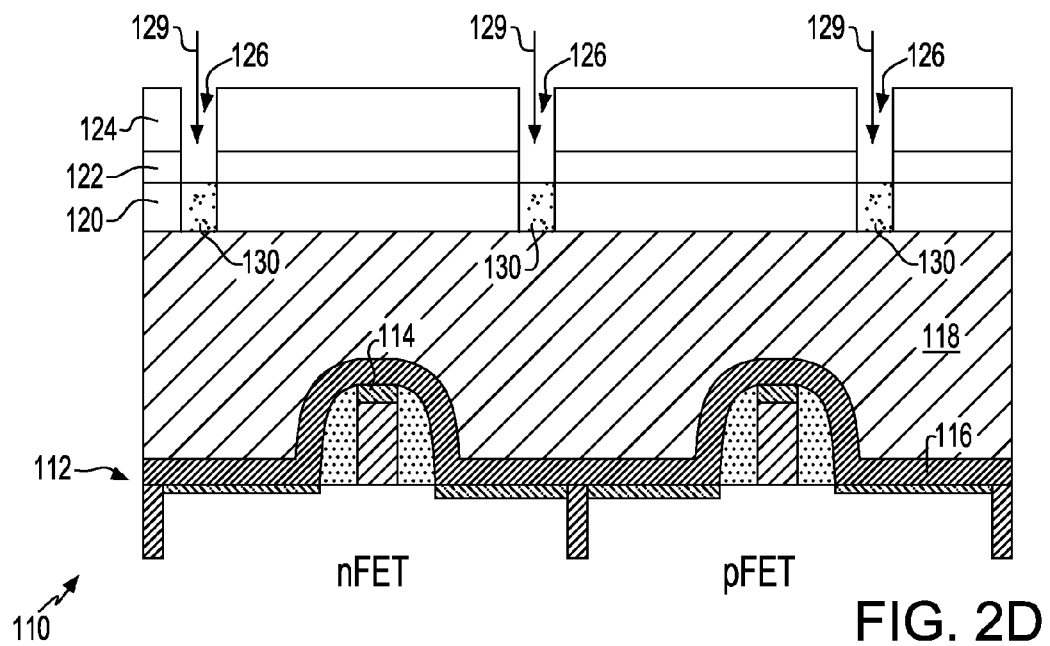

Referring now to FIG. 2D, the exposed areas 130 of the silicon layer 120 are ion implanted as represented by arrows 129. It is preferred that the doping be with $n^+$ dopants including but not limited to phosphorus (P), arsenic (As), and antimony (Sb). The dopant level is greater than about $1 \times 10^{18}$ atoms/cm$^3$. The ion implantation energy is dependent upon the desirable depth of the dopant layer and will range from a few Kev to a few tenths of Kev. The purpose of the doping will become apparent hereafter.

Figure 2E:
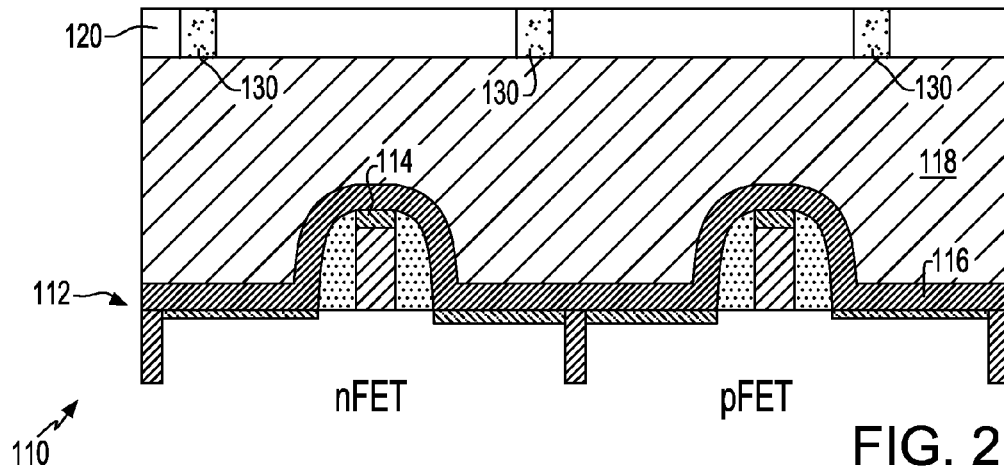

The ARC layer 122 and photoresist layer/mask 124 are then stripped by conventional means to result in the structure shown in FIG. 2E.

Figure 2F:
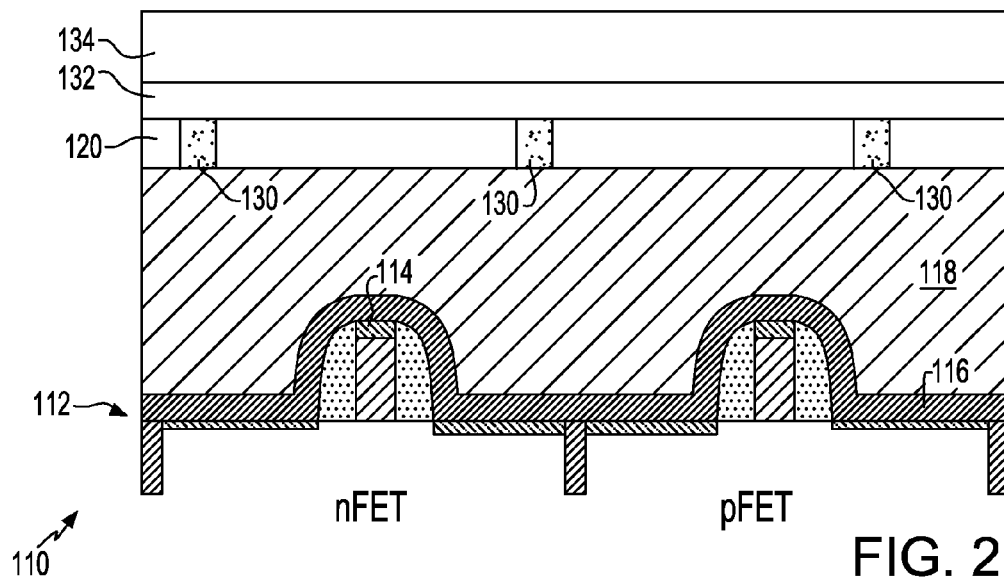
Figure 2G:
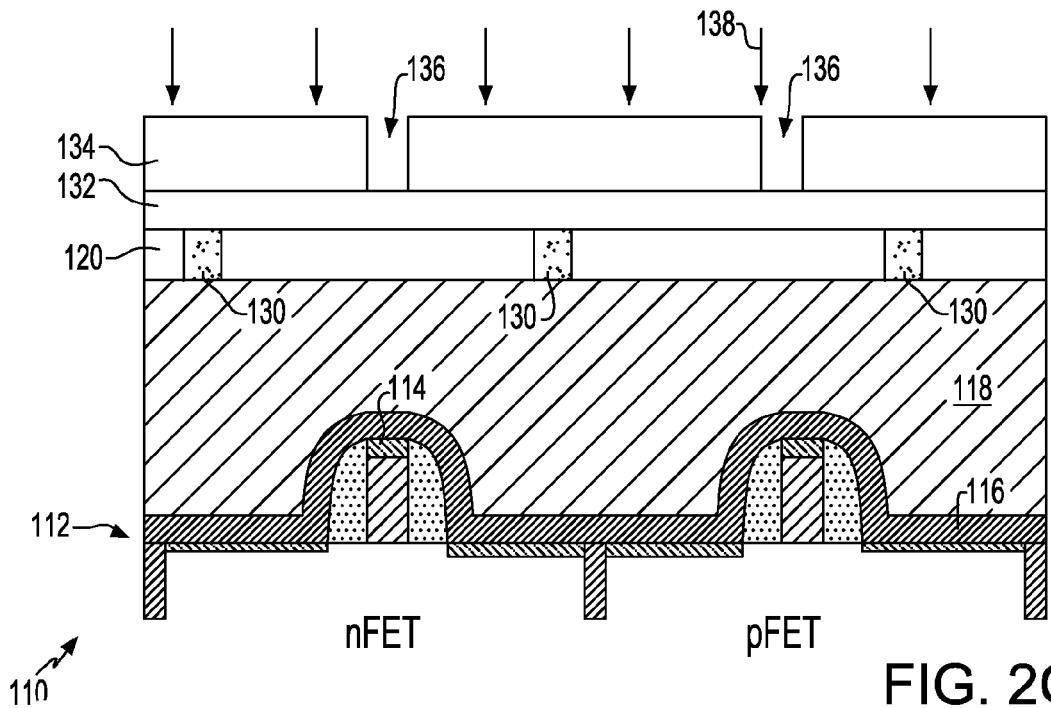

Thereafter, a second ARC layer 132 and a second photoresist layer 134 are applied, as shown in FIG. 2F, followed by exposing and developing of the photoresist layer 134 to form image openings 136 as shown in FIG. 2G. Image openings 136 will eventually be transferred into the underlying layers to form the second feature openings.

Figure 2H:
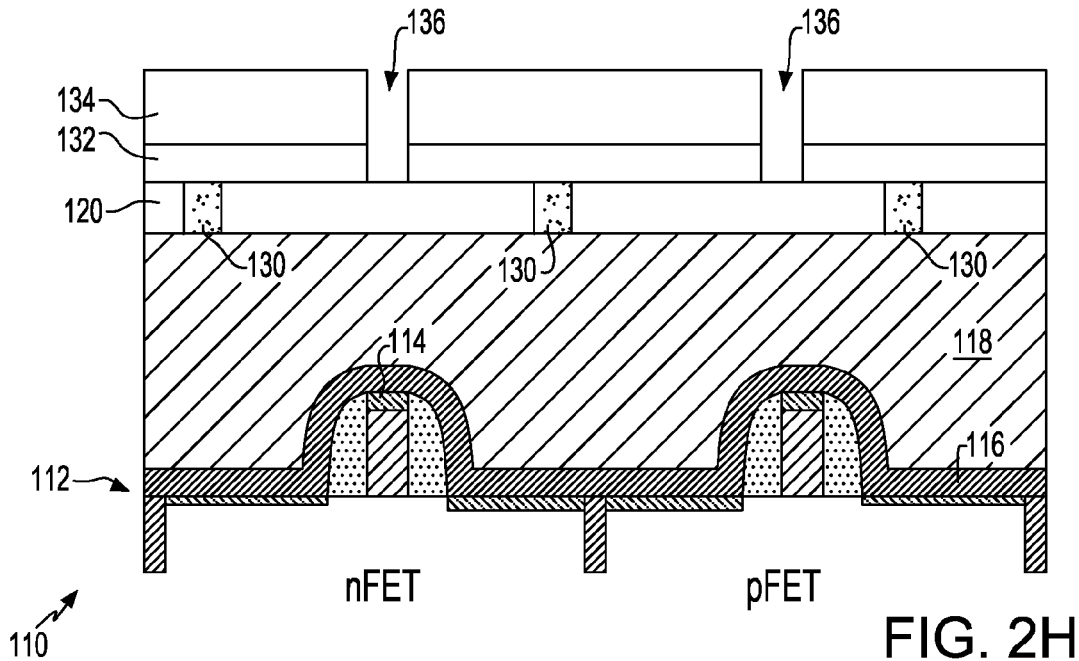
Figure 2I:
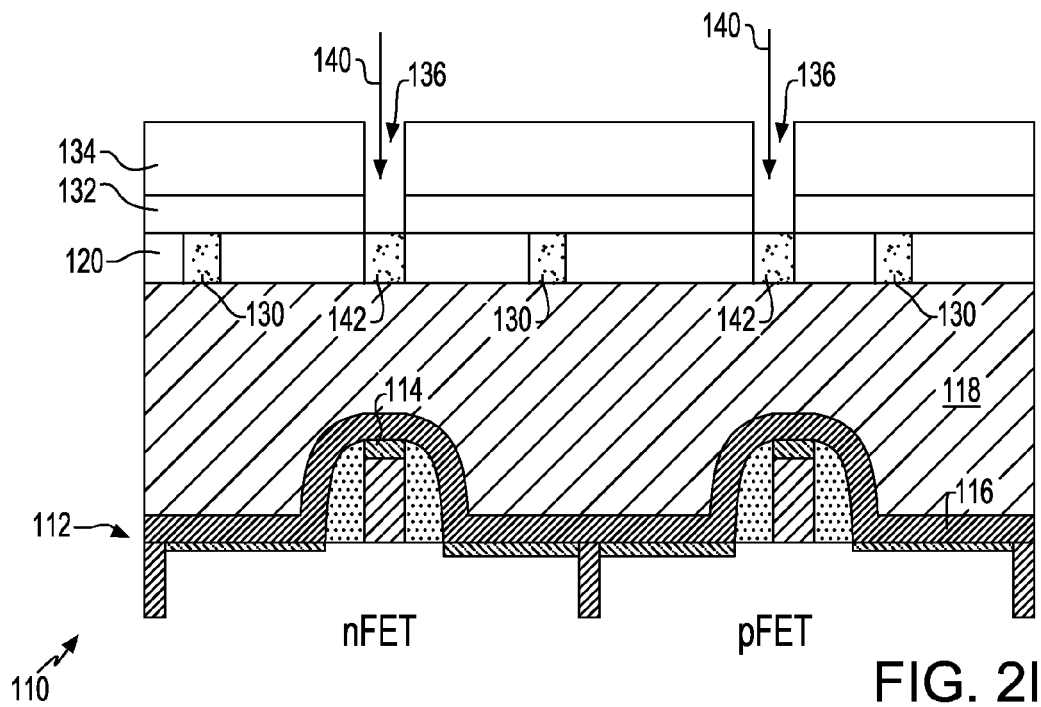

The photoresist layer 134 will be plasma etched as described previously and as indicated by arrows 138 to remove the ARC layer 132 in the openings 136, FIG. 2H, followed by ion implanting as before indicated by arrows 140 in FIG. 2I in the exposed regions 142 underneath the openings 136 resulting in the structure shown in FIG. 2I.

Figure 2J:
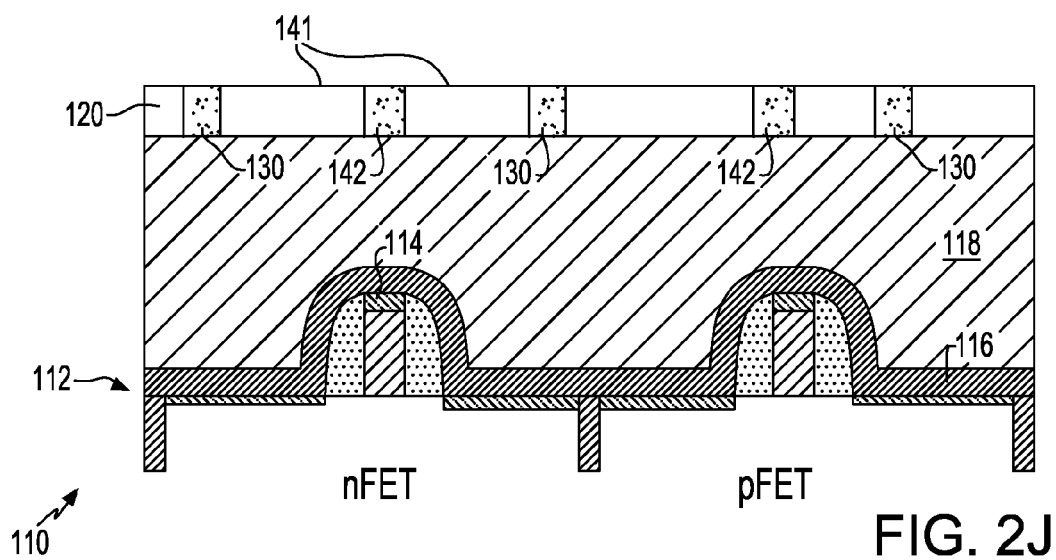

Referring now to FIG. 2J, the photoresist layer/mask 134 and ARC layer 132 are stripped by conventional means. The non-implanted areas in silicon layer 120 are indicated at 141. The steps of resist apply, ARC open and implantation can be repeated as necessary (i.e., more than two times) in order to achieve a predetermined number and density of features.

Figure 2K:
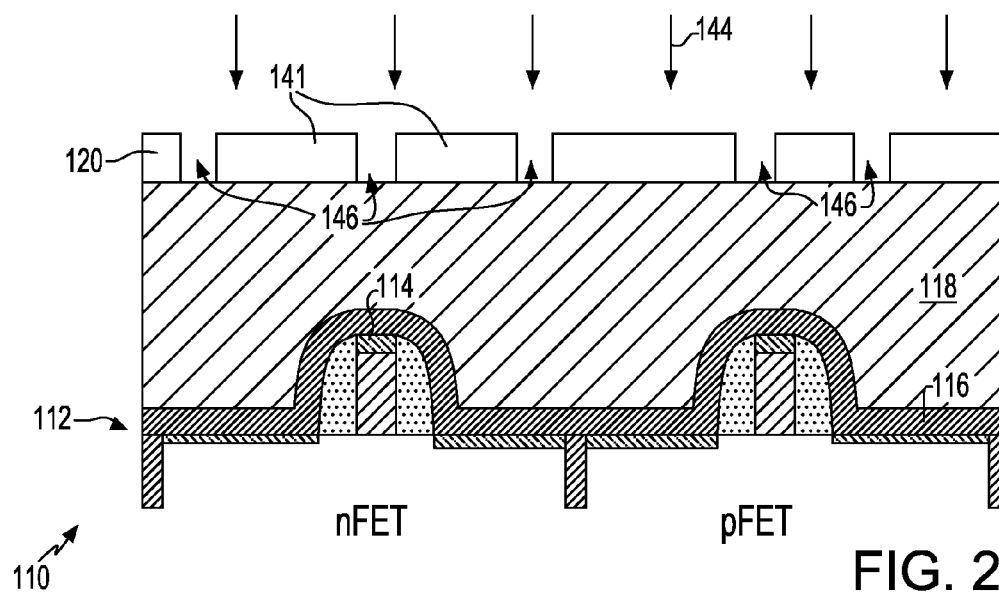

Referring now to FIG. 2K, the processing continues by reactive ion etching 144 the semiconductor wafer 110 and particularly the silicon layer 120 to selectively etch the $n^+$ doped silicon areas 130, 142. A preferred process is inductively coupled plasma, chlorine based plasma, 100-800 watts source RF power, 0-100 watts bias RF power, 3-100 mTorr pressure and a wafer chuck temperature of 20-80° C. The reactive ion etching is chosen so that it has a very high selectivity for etching the $n^+$ doped silicon over the non-$n^+$ doped silicon (for example, >200:1). Thus, doped regions 130, 142 of silicon are now replaced with openings 146 in the silicon, which can then be transferred into the underlying layers to form the first and second features.

Figure 2L:
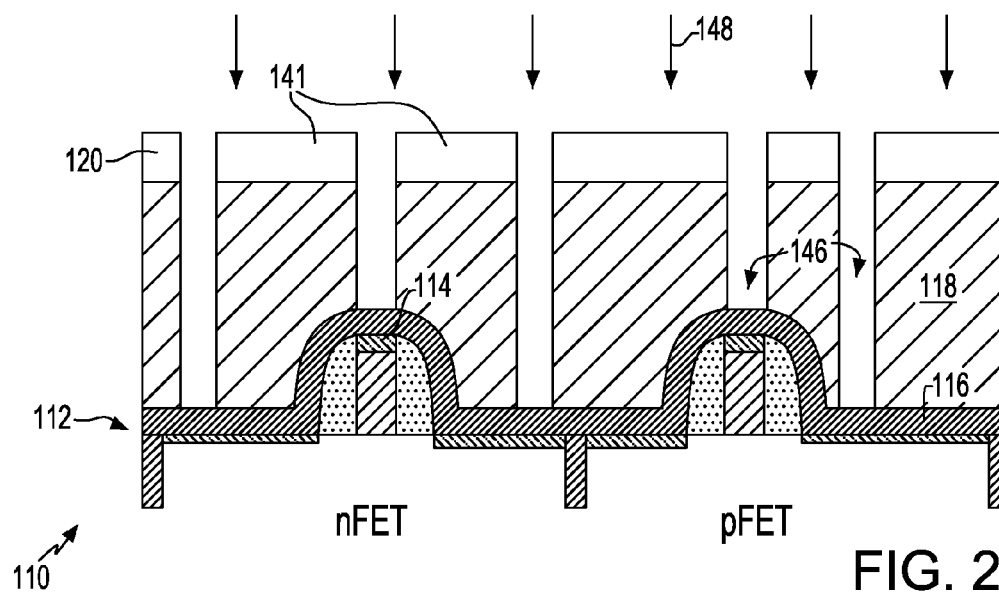

Thereafter, the silicon layer 120 with openings 146 will be used as a mask for the reactive ion etching as represented by arrows 148 of oxide layer 118. A preferred reactive ion etching process is inductively coupled plasma or capacitively coupled plasma with one or dual RF frequency power, a fluorine carbon gas such as $C_3F_6$, $C_4F_8$, $CF_4$, $CH_2F_2$, $CH_3F$ and combinations thereof. The fluorine carbon gas may be diluted with an inert gas such as argon. There will be 100-2000 watts source RF power, 100-150 watts bias RF power, 3-100 mTorr pressure and a wafer chuck temperature of 0-25° C. Openings 146 will be transferred into the oxide as shown in FIG. 2L. During the reactive ion etching process 148, the silicon layer 120 will be partially consumed.

Figure 2M:
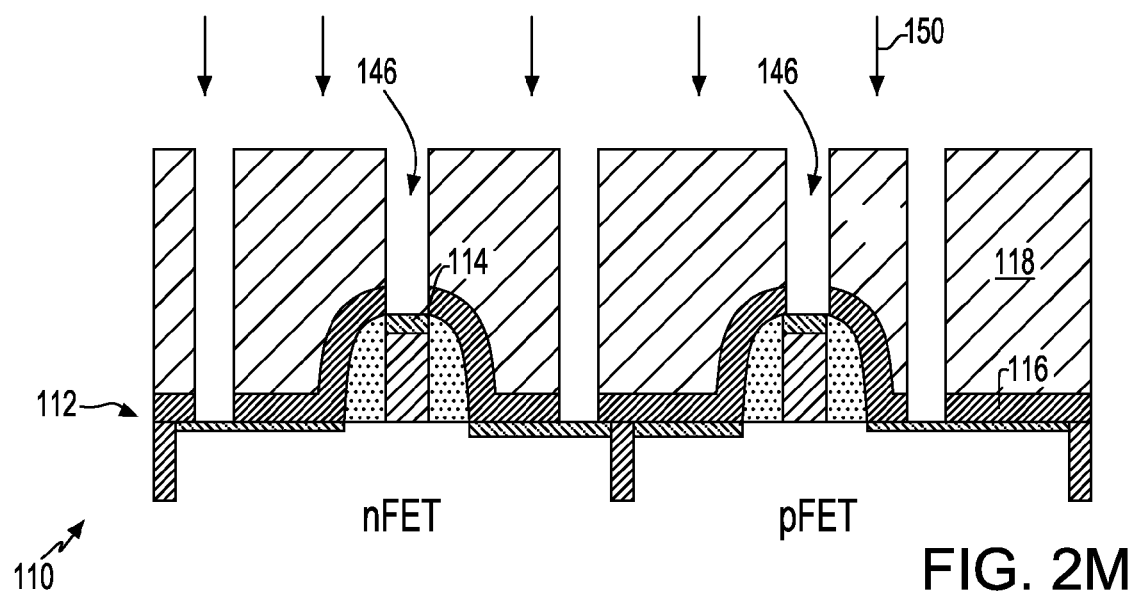

The reactive ion etching recipe is changed to a lower carbon to fluorine (C/F) ratio and then the semiconductor wafer 110 is etched as represented by arrows 150 to transfer the openings 146 into the barrier nitride layer 116. A preferred reactive ion etching process is inductively coupled plasma or capacitively coupled plasma with one or dual RF frequency power, a fluorine carbon gas such as $CF_4$, $CHF_3$, $CH_2F_2$ and combinations thereof. The fluorine carbon gas may be diluted with an inert gas such as argon. There will be 100-2000 watts source RF power, 100-150 watts bias RF power, 3-100 mTorr pressure and a wafer chuck temperature of 0-25° C. During the etching step, the remaining silicon layer 120 and part of the oxide 118 are being consumed. The resulting structure shown in FIG. 2M is particularly useful for forming contact arrays. In subsequent steps, metallization would be deposited in openings 146 and then metal layers (not shown) would be added as is conventional.

While the present invention has been illustrated with respect to the forming of contact arrays in semiconductor wafers, it can be appreciated that the present invention would be applicable to other applications in which multiple exposure and double etching are utilized.

The present invention has at least the following advantages:

Features, particularly contact arrays, are formed using multiple lithography exposure and a single etch step with pitches less than the limits of resolution of a conventional lithography tool.

One etch step is eliminated from the more commonly used double lithography exposure and double etch integration scheme to solve the pitch limitation issue.

One flat silicon layer, preferably polysilicon or amorphous silicon, is used as the mask for both lithographic exposures to eliminate mask topography issues.

The problem of optically dense layer residue in the feature openings is eliminated.

ARC/optically dense layer thickness variation in the second lithography step caused by the first etch topology is eliminated.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

The invention claimed is:

1. An integration method comprising the steps of:
    obtaining a semiconductor wafer having features thereon;
    depositing sequential layers of oxide and silicon over the semiconductor wafer and the features;
    depositing a first photoresist layer;
    forming first openings in the first photoresist layer to expose the silicon layer;
    selectively ion implanting in the silicon layer through the first openings to form first ion implanted regions;
    removing the first photoresist layer;
    depositing a second photoresist layer;
    forming second openings in the second photoresist layer to expose the silicon layer;
    selectively ion implanting in the silicon layer through the second openings to form second ion implanted regions;
    removing the second photoresist layer;
    reactive ion etching the entire silicon layer to form openings only in portions of the silicon layer that were formerly occupied by the first and second ion implanted regions, the reactive ion etching being chosen such that it has a high selectivity for etching the first and second ion implanted regions with respect to the silicon layer not containing the first and second ion implanted regions; and
    etching the oxide layer to extend the openings in the silicon layer through the oxide layer to the features.

2. The method of claim 1 wherein the openings are for a contact array.

3. The method of claim 1 wherein at least one opening in the silicon layer formerly occupied by the first ion implanted regions is adjacent to at least one opening in the silicon layer formerly occupied by the second ion implanted regions and wherein the adjacent openings are less than the resolution of the lithography tool.

4. The method of claim 1 wherein the silicon of the silicon layer is selected from the group consisting of polysilicon and amorphous silicon.

5. The method of claim 1 wherein in the steps of ion implanting, $n^+$ dopants are implanted.

6. The method of claim 5 wherein the n+ dopants are selected from the group consisting of As, P, and Sb.

7. An integration method comprising the steps of:
obtaining a semiconductor wafer having features thereon;
depositing sequential layers of oxide and silicon over the semiconductor wafer and the features;
selectively ion implanting in the silicon layer to form first ion implanted regions;
selectively ion implanting in the silicon layer to form second ion implanted regions;
reactive ion etching the entire silicon layer to form openings only in portions of the silicon layer that were formerly occupied by the first and second ion implanted regions, the reactive ion etching being chosen such that it has a selectivity of greater than 200 to 1 for etching the first and second ion implanted regions with respect to the silicon layer not containing the first and second ion implanted regions; and
etching the oxide layer to extend the openings in the silicon layer through the oxide layer to the features.

8. The method of claim 7 wherein the openings are for a contact array.

9. The method of claim 7 wherein at least one opening in the silicon layer formerly occupied by the first ion implanted regions is adjacent to at least one opening in the silicon layer formerly occupied by the second ion implanted regions and wherein the adjacent openings are less than the resolution of the lithography tool.

10. The method of claim 7 wherein the silicon of the silicon layer is selected from the group consisting of polysilicon and amorphous silicon.

11. The method of claim 7 wherein in the steps of ion implanting, $n^+$ dopants are implanted.

12. The method of claim 11 wherein the n+ dopants are selected from the group consisting of As, P, and Sb.

13. A multiple exposure and single oxide etch integration method comprising the steps of:
obtaining a semiconductor wafer having gate stacks thereon;
depositing a barrier nitride layer over the gate stacks and the semiconductor wafer;
depositing sequential layers of oxide, silicon, first anti-reflective compound (ARC) and first photoresist;
lithographically exposing and developing the first photoresist layer to form first image openings in the first photoresist layer;
etching the first ARC layer through the first image openings in the first photoresist layer;
ion implanting in the silicon layer through the first images openings in the first ARC and first photoresist layers to form first ion implanted regions;
stripping the first photoresist and ARC layers;
depositing a second layer of ARC over the silicon layer and depositing a second layer of photoresist over the second layer of ARC;
lithographically exposing and developing the second layer of photoresist to form second image openings in the second layer of photoresist, the second image openings being offset from the first image openings;
etching the second ARC layer through the second image openings in the second photoresist layer;
ion implanting in the silicon layer through the second image openings in the second ARC and second photoresist layers to form second ion implanted regions;
stripping the second photoresist and second ARC layers;
reactive ion etching the silicon layer to form openings in the silicon layer that were formerly occupied by the first and second ion implanted regions;
etching the oxide layer to extend the openings in the silicon layer through the oxide layer; and
etching the barrier nitride layer to extend the openings in the silicon and oxide layers through the nitride layer.

14. The method of claim 13 wherein the semiconductor wafer is a CMOS wafer.

15. The method of claim 13 wherein the silicon of the silicon layer is selected from the group consisting of polysilicon and amorphous silicon.

16. The method of claim 13 wherein at least one opening in the silicon layer formerly occupied by the first ion implanted regions is adjacent to at least one opening in the silicon layer formerly occupied by the second ion implanted regions and wherein the adjacent openings are less than the resolution of the lithography tool.

17. The method of claim 13 wherein in the steps of ion implanting, $n^+$ dopants are implanted.

18. The method of claim 17 wherein the n+ dopants are selected from the group consisting of As, P, and Sb.

19. An integration method comprising the steps of:
obtaining a semiconductor wafer having gate stacks thereon;
depositing a barrier nitride layer over the gate stacks and the semiconductor wafer;
depositing sequential layers of oxide, silicon, first anti-reflective compound (ARC) and first photoresist;
lithographically exposing and developing the first photoresist layer to form first image openings in the first photoresist layer;
plasma etching the first ARC layer through the first image openings in the first photoresist layer;
ion implanting in the silicon layer through the first images openings in the first ARC and first photoresist layers to form first ion implanted regions;
stripping the first photoresist and first ARC layers;
reactive ion etching the silicon layer to form openings in the silicon layer that were formerly occupied by the ion implanted regions;
etching the oxide layer to extend the openings in the silicon layer through the oxide layer; and
etching the barrier nitride layer to extend the openings in the silicon and oxide layers through the nitride layer.

20. The method of claim 19 wherein after the step of stripping the first photoresist and ARC layers, further comprising the steps of:
depositing a second layer of ARC over the silicon layer and depositing a second layer of photoresist over the second layer of ARC;
lithographically exposing and developing the second layer of photoresist to form second image openings in the second layer of photoresist, the second image openings being offset from the first image openings;
etching the second ARC layer through the second image openings in the second photoresist layer;
ion implanting in the silicon layer through the second image openings in the second ARC and second photoresist layers to form second ion implanted regions;
stripping the second photoresist and second ARC layers.

21. The method of claim 20 wherein the semiconductor wafer is a CMOS wafer.

22. The method of claim 20 wherein the silicon of the silicon layer is selected from the group consisting of polysilicon and amorphous silicon.

23. The method of claim 20 wherein in the steps of ion implanting, $n^+$ dopants selected from the group consisting of As, P, and Sb are implanted.

24. The method of claim 20 wherein at least one opening in the silicon layer formerly occupied by the first ion implanted regions is adjacent to at least one opening in the silicon layer formerly occupied by the second ion implanted regions and wherein the adjacent openings are less than the resolution of the lithography tool.

\* \* \* \* \*